(12) United States Patent
Bergin et al.

(10) Patent No.: US 11,113,433 B2
(45) Date of Patent: Sep. 7, 2021

(54) TECHNIQUE FOR GENERATING A SPECTRUM OF FEASIBLE DESIGN SOLUTIONS

(71) Applicant: AUTODESK, INC., San Rafael, CA (US)

(72) Inventors: Michael Bergin, El Cerrito, CA (US); Mark Thomas Davis, Mill Valley, CA (US)

(73) Assignee: AUTODESK, INC., San Rafael, CA (US)

( * ) Notice: Subject to any disclaimer, the term of this patent is extended or adjusted under 35 U.S.C. 154(b) by 1058 days.

(21) Appl. No.: 14/951,297

(22) Filed: Nov. 24, 2015

(65) Prior Publication Data
US 2016/0147911 A1    May 26, 2016

Related U.S. Application Data

(60) Provisional application No. 62/084,490, filed on Nov. 25, 2014.

(51) Int. Cl.
*G06F 30/20* (2020.01)
*G05B 19/4097* (2006.01)
(Continued)

(52) U.S. Cl.
CPC ......... *G06F 30/20* (2020.01); *G05B 19/4097* (2013.01); *G06F 3/0481* (2013.01);
(Continued)

(58) Field of Classification Search
CPC ...... G05B 19/4097; G05B 2219/32089; G05B 2219/35012; G05B 2219/35021;
(Continued)

(56) References Cited

U.S. PATENT DOCUMENTS 5,510,995 A * 4/1996 Oliver ................ G05B 19/4099
345/419
8,392,160 B2   3/2013 Brincat et al.
(Continued)

FOREIGN PATENT DOCUMENTS

CN   101038599 A   9/2007
JP   05-081355 A   4/1993

OTHER PUBLICATIONS

Arieff, A. 2013. New Forms that Function Better. MIT Technology Review http://www.technologyreview.com/review/517596/new-formsthat-function-better/ pp. 1-10.
(Continued)

*Primary Examiner* — Justin C Mikowski
(74) *Attorney, Agent, or Firm* — Artegis Law Group, LLP

(57) ABSTRACT

A design application generates feasible engineering designs that satisfy criteria associated with a particular engineering problem. The design application receives input that outlines a specific engineering problem to be solved, and then synthesizes a problem specification based on this input. The design application then searches a database to identify different classes of approaches to solving the design problem set forth in the problem specification. The design application then selects one or more such classes of approaches, and generates a spectrum of potential design solutions for each such approach. The generated solutions may then be evaluated to determine the degree to which the problems specification has been met.

19 Claims, 6 Drawing Sheets

(51) Int. Cl.
G06F 16/44 (2019.01)
G06F 30/00 (2020.01)
G06F 3/0481 (2013.01)
G06F 3/0484 (2013.01)
G06T 15/10 (2011.01)
G06T 19/20 (2011.01)

(52) U.S. Cl.
CPC ........ *G06F 3/04847* (2013.01); *G06F 16/444* (2019.01); *G06F 30/00* (2020.01); *G06T 15/10* (2013.01); *G06T 19/20* (2013.01); *G05B 2219/32089* (2013.01); *G05B 2219/35012* (2013.01); *G05B 2219/35021* (2013.01); *G05B 2219/49301* (2013.01); *Y02P 80/40* (2015.11)

(58) Field of Classification Search
CPC ..... G05B 2219/49301; G06F 17/30061; G06F 17/50; G06F 17/5009; G06F 3/0481; G06F 3/04847; G06F 16/444; G06F 30/00; G06F 30/20; G06T 15/10; G06T 19/20; Y02P 80/40
USPC ............................................................ 703/1
See application file for complete search history.

(56) References Cited

U.S. PATENT DOCUMENTS

| | | | |
|---|---|---|---|
| 8,589,125 B2* | 11/2013 | Mori | G06F 30/15 703/2 |
| 8,666,702 B2 | 3/2014 | Schell | |
| 8,818,769 B2 | 8/2014 | Trainer et al. | |
| 9,785,727 B1 | 10/2017 | Wilson | |
| 2003/0210241 A1 | 11/2003 | Minami et al. | |
| 2005/0038821 A1 | 2/2005 | Wallen et al. | |
| 2006/0058985 A1 | 3/2006 | Arslan et al. | |
| 2006/0066609 A1 | 3/2006 | Iodice et al. | |
| 2007/0078634 A1 | 4/2007 | Krishnapillai | |
| 2007/0118243 A1 | 5/2007 | Schroeder et al. | |
| 2008/0222110 A1* | 9/2008 | Hayashi | G06F 17/30011 |
| 2008/0319928 A1 | 12/2008 | Hashimoto et al. | |
| 2009/0089027 A1* | 4/2009 | Sturrock | G05B 17/02 703/6 |
| 2009/0306801 A1 | 12/2009 | Sivak et al. | |
| 2013/0170171 A1 | 7/2013 | Wicker et al. | |
| 2013/0233618 A1 | 9/2013 | Nakano et al. | |
| 2014/0108953 A1 | 4/2014 | Greene et al. | |
| 2014/0149084 A1* | 5/2014 | Iorio | G06F 30/00 703/1 |
| 2015/0099059 A1 | 4/2015 | Harjee et al. | |
| 2015/0324489 A1 | 11/2015 | Onodera | |
| 2015/0356207 A1 | 12/2015 | Reitman et al. | |
| 2015/0362898 A1 | 12/2015 | Potter | |

OTHER PUBLICATIONS

Bertini, E., Dell'Aquila, L., & Santucci, G. 2005. "SpringView: cooperation of radviz and parallel coordinates for view optimization and clutter reduction". In Coordinated and Multiple Views in Exploratory Visualization. (8 pages).
Draper, G., Livnat, Y., & Riesenfeld, R. F. 2009. "A survey of radial methods for information visualization". In Visualization and Computer Graphics. pp. 1-45.
Dunne, C. and Shneiderman, B. 2013. "Motif simplification: improving network visualization readability with fan, connector, and clique glyphs". In Proc CHI '13 (14 pages).
Flager, F. and Haymaker, J. 2007. "A Comparison of Multidisciplinary Design, Analysis and Optimization Processes in the Building Construction and Aerospace Industries". In Proc. of the 24th International Conference on Information Technology in Construction. pp. 1-12.
Flager, F., Welle, B., Bansal, P., Soremekun, G., Haymaker, J. 2009. "Multidisciplinary process integration and design optimization of a classroom building". Journal of Information Technology in Construction, vol. 14. 595-612.
Gerber, D. J., Lin, S.-H., Pan, B. and Solmaz, A. S. 2012. "Design optioneering: multi-disciplinary design optimization through parameterization, domain integration and automation of a genetic algorithm". In Proc. Symposium on Simulation for Architecture and Urban Design, Society for Computer Simulation International. (pp. 23-30).
Graham, M., & Kennedy, J. 2003. "Using curves to enhance parallel coordinate visualisations". In Information Visualization, 2003.
Grossman, T., Matejka, T. and Fitzmaurice, G. 2010. "Chronicle: capture, exploration, and playback of document workflow histories". In Proc UIST '10. (pp. 143-152).
Hauser, H., Ledermann, F., & Doleisch, H. 2002. "Angular brushing of extended parallel coordinates". In Information Visualization, 2002. (4 pages).
Holzer, D., Hough, R. and Burry, M. 2007. "Parametric Design and Structural Optimisation for Early Design Exploration". International, Journal of Architectural Computing, vol. 5, 4. 625-643.
Lunzer, A. and Hornbæk, K. 2008. "Subjunctive interfaces: Extending applications to support parallel setup, viewing and control of alternative scenarios". ACM Transactions on Computer-Human Interaction vol. 14, 4. 1-17.
Maile, T., Fischer, M., Bazjanac, V. 2007. "Building energy performance simulation tools—a life-cycle and interoperable perspective". Working Paper. Center for Integrated Facility Engineering, Stanford University. (47 pages).
Marks, J., Andalman, B., Beardsley, P. A., Freeman, W., Gibson, S., Hodgins, J., . . . & Shieber, S. 1997. "Design galleries: A general approach to setting parameters for computer graphics and animation". In Proc. of the 24th annual conference on Computer graphics and interactive techniques.
Shah, J., Vergas-Hernandez, N., Smith, S. 2003. "Metrics for measuring ideation effectiveness". Design Studies vol. 24. 111-134.
Shneiderman, B. 1996. "The eyes have it: A task by data type taxonomy for information visualizations". In Proc. of IEEE Symposium on Visual Languages. (pp. 336-343).
Shneiderman, B., Hewett, T., Fischer, G., Jennings, P. 2006. et al. "Creativity Support Tools: Report from a US National Science Foundation Sponsored Workshop". International Journal of Human Computer Interaction, 20, 2. 61-77.
Steed, C. A., Fitzpatrick, P. J., Jankun-Kelly, T. J., Yancey, A. N., & Swan II, J. E. 2009. "An interactive parallel coordinates technique applied to a tropical cyclone climate analysis". Computers & Geosciences. (pp. 1-40).
Strauss, A. and Corbin, J. 1998. "Basics of qualitative research: Techniques and procedures for developing grounded theory". Thousand Oaks, CA: Sage. (133 pages).
Terry, M. Mynatt, E.D., Nakakoji, K, and Yamamoto, Y. 2004. "Variation in element and action: supporting simultaneous development of alternative solutions". In Proc CHI '04 (pp. 711-718).
Thibodeau, T. 2013. "U.S. makes a Top 10 supercomputer available to anyone who can 'boost' America". In www.computerworld.com.
Ward, M. O. 1994."Xmdvtool: Integrating multiple methods for visualizing multivariate data". In Proc. of the Conference on Visualization. (9 pages).
Ward, M. O. 2002. "A taxonomy of glyph placement strategies for multidimensional data visualization". Information Visualization. (pp. 194-210).
Wegman, E. J. 1990. "Hyperdimensional data analysis using parallel coordinates". Journal of the American Statistical Association. (pp. 664-675).
Wong, P. C., & Bergeron, R. D. 1994. "30 Years of Multidimensional Multivariate Visualization". In Scientific Visualization. (pp. 1-30).
Non-final Office Action for U.S. Appl. No. 14/951,310 dated Jun. 7, 2018, 21 pages.
Final Office Action received in U.S. Appl. No. 14/951,310, dated Dec. 12, 2019, 39 pages.
Non-Final Office Action received in U.S. Appl. No. 14/951,338, dated Dec. 11, 2019, 32 pages.

(56) References Cited

OTHER PUBLICATIONS

Final Office Action received in U.S. Appl. No. 14/951,349, dated Oct. 24, 2019, 23 pages.
Non-Final Office Action received in U.S. Appl. No. 14/951,366, dated Nov. 12, 2019, 23 pages.

* cited by examiner

TECHNIQUE FOR GENERATING A SPECTRUM OF FEASIBLE DESIGN SOLUTIONS

CROSS-REFERENCE TO RELATED APPLICATIONS

This application claims the benefit of U.S. provisional patent application titled "Dreamcatcher: Approaches for Design Variation," filed on Nov. 25th, 2014 and having Ser. No. 62/084,490. The subject matter of this related application is hereby incorporated herein by reference.

BACKGROUND OF THE INVENTION

Field of the Invention

Embodiments of the present invention relate generally to engineering design and, more specifically, to techniques for generating a spectrum of feasible design solutions.

Description of the Related Art

In a conventional engineering workflow, an engineer uses a computer-aided design (CAD) tool to design and draft physical parts. In doing so, the engineer typically makes design choices in accordance with a set of design objectives and/or design constraints. For example, in the design of a mechanical beam, one design objective could be that the beam must support at least a minimum amount of weight. One design constraint could be that the beam must not be subjected to greater than a maximum amount of stress in a given direction. Collectively, the various design objectives and design constraints constitute overall design criteria.

Conventional CAD tools provide engineers with simulation environments for testing designed parts. More particularly, once the engineer finishes designing a given part, the engineer may then simulate the part under different conditions in order to determine whether the part meets the design criteria. If the part does not meet the design criteria, then the engineer must begin the design process anew.

One drawback of the above approach is that conventional CAD tools allow engineers to consider only one design option at a time. However, for a given set of design criteria, thousands upon thousands of design options can potentially exist, most of which are never considered. This limitation exists for two reasons. First, conventional CAD tools cannot evaluate multiple design options simultaneously. Second, the human brain is not equipped to consider all possible outcomes to all design choices associated with a given part and a given set of design criteria.

As the foregoing illustrates, what is needed in the art is a more effective approach to exploring the range of design solutions that meet design criteria.

SUMMARY OF THE INVENTION

Various embodiments of the present invention sets forth a non-transitory computer-readable medium including instructions that, when executed by a processor, cause the processor to generate a spectrum of design solutions, by performing the steps of synthesizing a problem specification based on input associated with a design problem, where the problem specification indicates at least one design criterion, identifying within a database at least a first approach for solving the design problem, where each approach for solving the design problem included in the database comprises a different process for generating three-dimensional geometry, and generating a spectrum of design solutions for the first approach, where each design solution in the spectrum of design solutions represents a different instance of three-dimensional geometry that satisfies the at least one design criterion.

At least one advantage of this approach is that the end-user need not attempt to consider all possible approaches to solving the design problem. Instead, the design application identifies potentially promising approaches, and then generates actual designs based on those approaches, thereby alleviating the burden of generating designs from the end-user.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
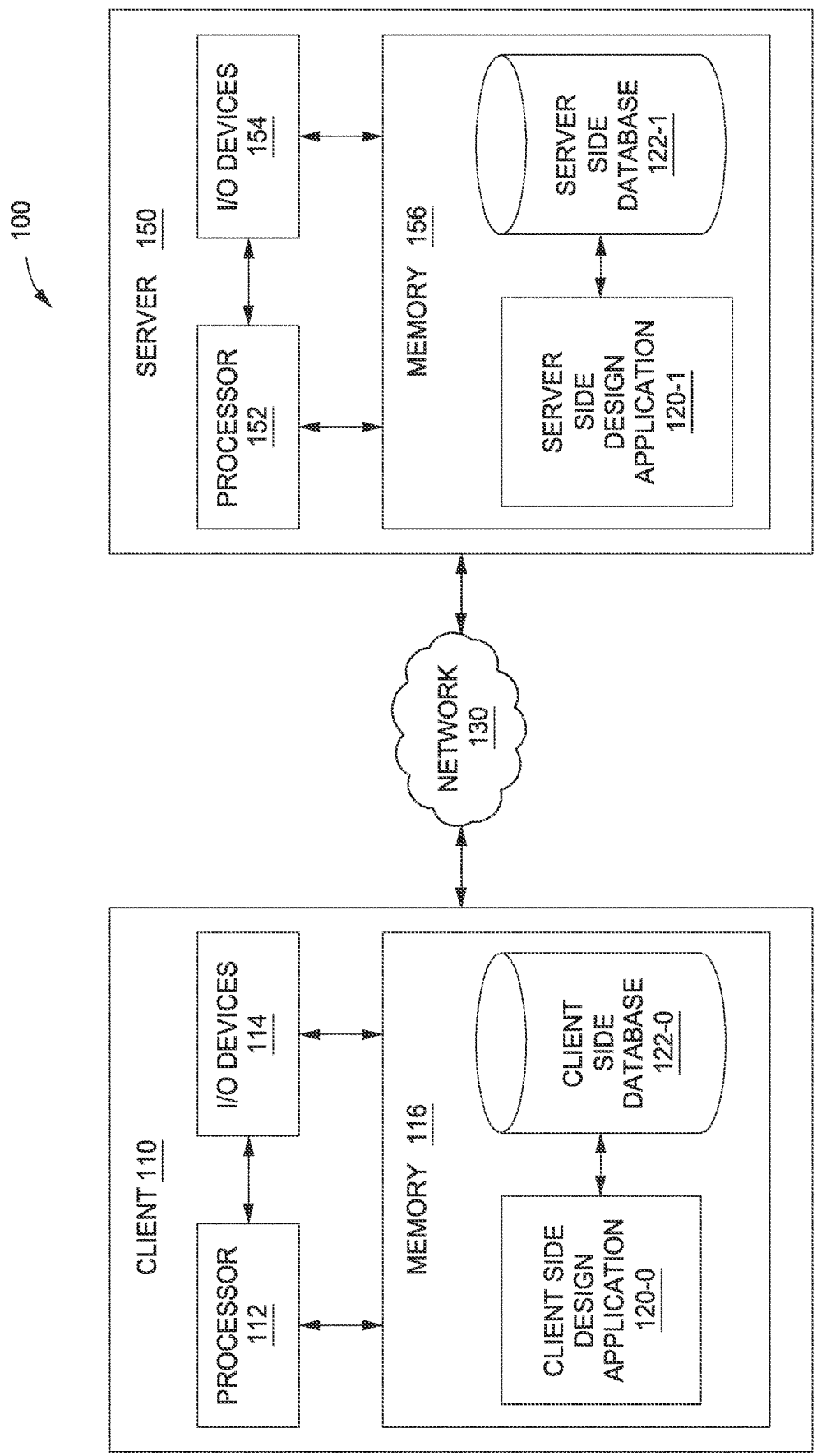
FIG. 1 illustrates a system configured to implement one or more aspects of the present invention.

FIG. 1 illustrates a system 100 configured to implement one or more aspects of the present invention. As shown, system 100 includes a client 110 coupled via a network 130 to a server 150. Client 110 may be any technically feasible variety of client computing device, including a desktop computer, laptop computer, mobile device, and so forth. Network 150 may be any technically feasible set of interconnected communication links, including a local area network (LAN), wide area network (WAN), the World Wide Web, or the Internet, among others. Server 150 may be any technically feasible type of server computing device, including a remote virtualized instance of a computing device, one or more physical cloud-based computing devices, a mixture of the two, a portion of a datacenter, and so forth.

Client 110 includes processor 112, input/output (I/O) devices 114, and memory 116, coupled together. Processor 112 may be any technically feasible form of processing device configured process data and execute program code. Processor 112 could be, for example, a central processing unit (CPU), a graphics processing unit (GPU), an application-specific integrated circuit (ASIC), a field-programmable gate array (FPGA), and so forth. I/O devices 114 may include devices configured to receive input, including, for example, a keyboard, a mouse, and so forth. I/O devices 114 may also include devices configured to provide output, including, for example, a display device, a speaker, and so forth. I/O devices 114 may further include devices configured to both receive and provide input and output, respectively, including, for example, a touchscreen, a universal serial bus (USB) port, and so forth.

Memory 116 may be any technically feasible storage medium configured to store data and software applications. Memory 116 could be, for example, a hard disk, a random access memory (RAM) module, a read-only memory (ROM), and so forth. Memory 116 includes client-side design application 120-0 and client-side database 122-0. Client-side design application 120-0 is a software application that, when executed by processor 112, causes processor 112 to generate a collection of design solutions that meet design criteria associated with a problem specification. In doing so, client-side design application 120-0 may access client-side database 122-0. Client-side design application 122-0 may also interoperate with a corresponding design application that resides within server 150 and access a database that also resides on server 150, as described in greater detail below.

Server 150 includes processor 152, I/O devices 154, and memory 156, coupled together. Processor 152 may be any technically feasible form of processing device configured to process data and execute program code, including a CPU, a GPU, an ASIC, an FPGA, and so forth. I/O devices 114 may include devices configured to receive input, devices configured to provide output, and devices configured to both receive and provide input and output, respectively.

Memory 156 may be any technically feasible storage medium configured to store data and software applications, including a hard disk, a RAM module, a ROM, and so forth. Memory 156 includes server-side design application 120-1 and server-side database 122-1. Server-side design application 120-1 is a software application that, when executed by processor 156, causes processor 152 to generate a collection of design solutions that meet design criteria associated with a problem specification. In doing so, server-side design application 120-1 may access server-side database 122-1. Server-side design application 122-1 may also interoperate with client-side design application 120-0 and access client-side database 122-0.

In operation, client-side design application 120-0 and server-side design application 120-1 cooperate to implement any and all of the inventive functionality described herein. In doing so, either one or both of client-side design application 120-0 and server-side design application 120-1 may access either one or both of client-side database 122-0 and server-side database 122-1. Generally, client-side design application 120-0 and server-side design application 120-1 represent different portions of single distributed software entity. Thus, for simplicity, client-side design application 122-0 and server-side design application 122-1 will be collectively referred to herein as design application 120. Similarly, client-side database 122-0 and server-side database 122-1 represent different portions of a single distributed storage entity. Therefore, for simplicity, client-side database 122-0 and server-side database 122-1 will be collectively referred to herein as database 122.

As described in greater detail below in conjunction with FIG. 2, design application 120 is configured to interact with an end-user in order to generate feasible engineering design solutions that satisfy criteria associated with a particular engineering problem. Design application 120 receives input from the end-user that outlines the specific engineering problem to be solved. Design application 120 then synthesizes a problem specification based on this input. Design application 120 searches database 122 to identify different approaches to solving the design problem outlined by the problem specification. Design application 120 then selects one or more such approaches. Based on the selected approaches, design application 120 generates a spectrum of potential design solutions for each such approach. Design application 120 then evaluates the generated designs, and presents that evaluation to the end-user.

One of the advantages of this technique is that the end-user need not attempt to consider all possible approaches to solving the design problem. Instead, design application 120 identifies potentially promising approaches. Further, design application 120 also generates actual designs based on those approaches, thereby alleviating the burden of generating designs from the end-user. FIG. 2 sets forth a more detailed description of the functionality discussed briefly above.

Figure 2:
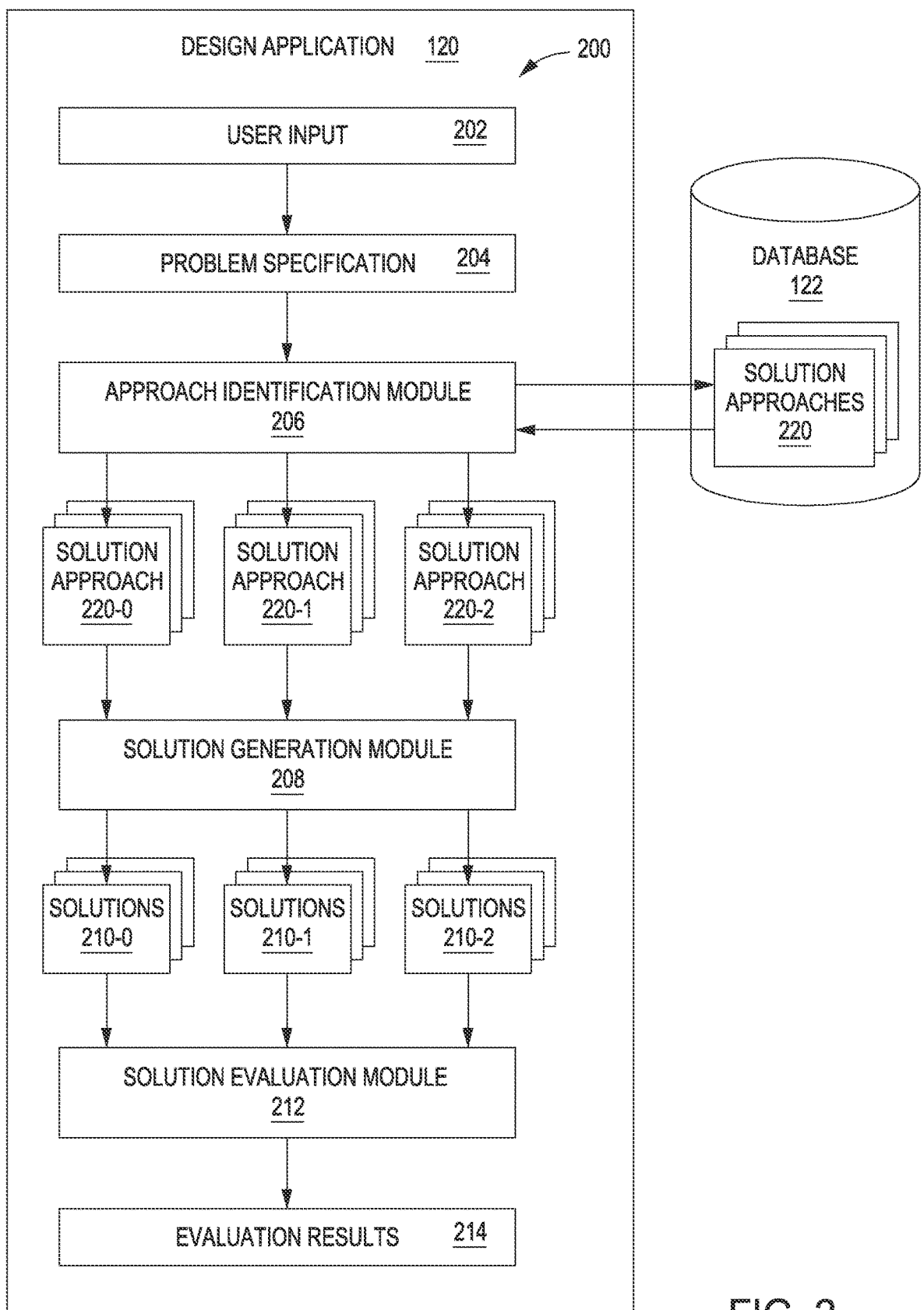
FIG. 2 is a more detailed illustration of the design application and database of FIG. 1, according to various embodiments of the present invention.

FIG. 2 is a more detailed illustration of the design application and database of FIG. 1, according to various embodiments of the present invention. As shown, design application 120 is coupled to database 122. Design application 120 includes various data and processing stages implemental in performing the inventive techniques described herein. Specifically, design application 120 includes user input 202, problem specification 204, approach identification module 206, solution generation module 208, solutions 210-0 through 210-2, solution evaluation module 212, and evaluation results 214. Database 122 includes data that is processed by design application 120 when performing the inventive techniques. In particular, database 122 includes solution approaches 220. As described in greater detail below, a "solution approach" is a particular process, procedure, algorithm, function, or system for generating 3D geometry that satisfies specific design criteria.

In operation, design application 120 is configured to receive user input 202 via interactions with an end-user. User input 202 generally reflects a set of design objectives, design constraints, and other criteria associated with specific engineering problem to be solved. User input 202 may also reflect particular geometrical or environmental objectives, constraints, and other criteria to be satisfied by a successful design. Generally, user input 202 includes input provided by the end-user via one or more input devices, such as a keyboard or a mouse, that corresponds to the above-described design criteria.

Design application 120 receives user input 202 and, based on that input, synthesizes problem specification 204. Problem specification 204 is a data structure that embodies all of the design criteria set forth in user input 202. For example, problem specification 204 could reflect a 3D environment that includes specific locations where certain forces are to be supported, within precise volumetric constraints, under particular weight limitations. An example of problem specification 204 is set forth below in conjunction with FIG. 4. In one embodiment, the end-user directly generates problem specification 204, via interaction with design application 120.

Based on problem specification 204, design application 120 invokes approach identification module 206 to search database 122 for a subset of solution approaches 220 applicable to problem specification 204. Solution approaches 220 may include a wide variety of different methodologies for solving engineering problems. Thus, each solution approach 220 may be defined in a number of different ways. One example of a solution approach 220 would be a parametric modeling tool that outlines a parametric function for creating a 3D object. Alternatively, a procedural design synthesis technique, such as topology optimization or truss optimization, could define a solution approach 220. Each solution approach 220 may also reflect a particular manufacturing process that could potentially be used to manufacture a design. Generally, each different solution approach 220 may be associated with a different design condition.

Approach identification module 206 searches solution approaches 220 within database 122 and identifies solution approaches 220-0, 220-1, and 220-2 that may be applicable to problem specification 204. For example, suppose problem specification 204 called for a spring-loaded lever arm capable of supplying a particular force at a given deflection. Approach identification module 206, upon determining that a spring-type design may be relevant, could identify solution approaches 220-0, 220-1, and 220-2 that indicate engineering procedures relevant to the design and manufacture of springs.

In one embodiment, approach identification module 206 identifies relevant solution approaches 220 by classifying problem specification 204, and then retrieving solution approaches 220 associated with that class of problem specification 204. In doing so, approach identification module 208 may rely on artificial neural networks (ANNs), machine learning techniques, or other types of technically feasible classifiers.

Figure 5:
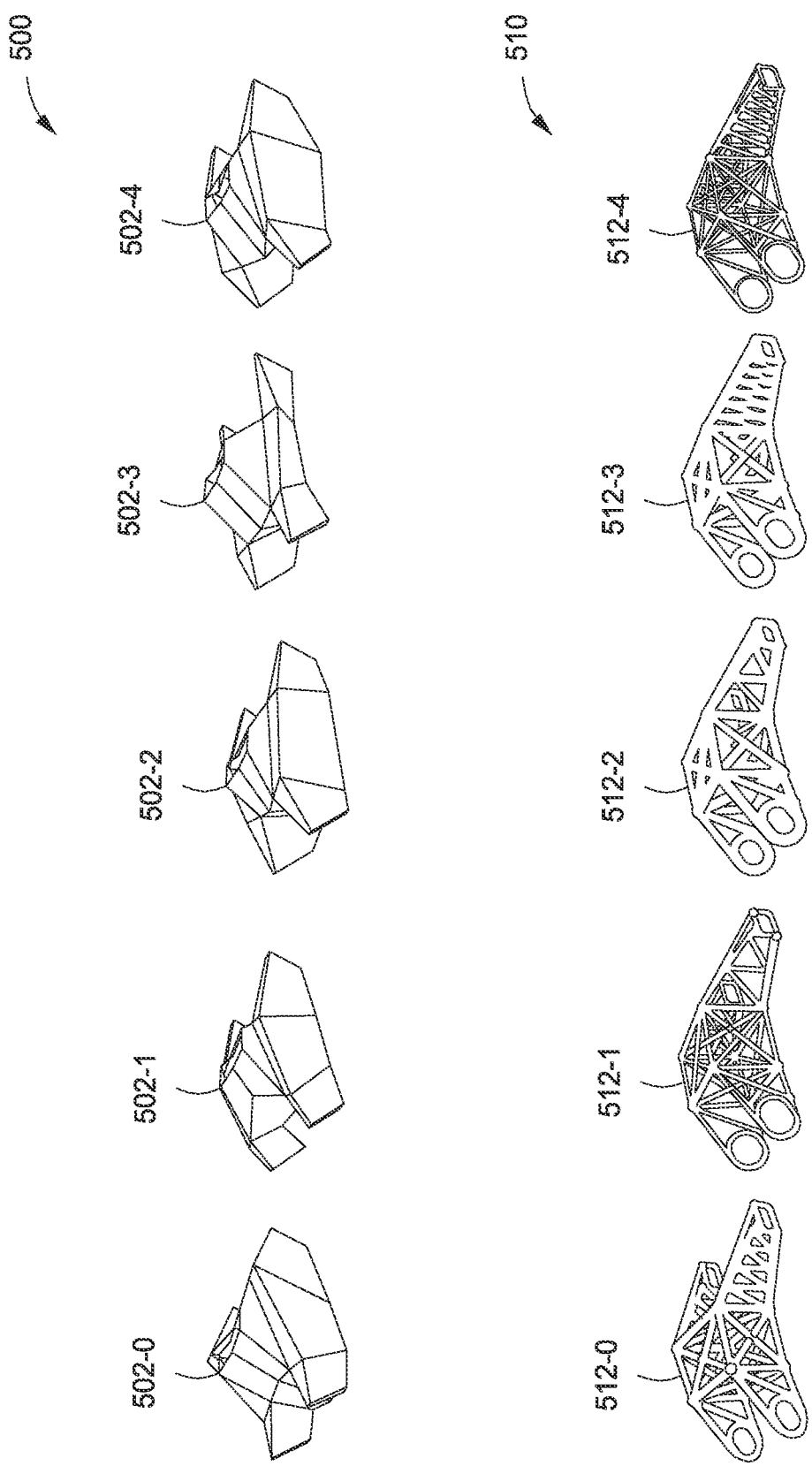
FIG. 5 illustrates exemplary spectra of feasible design alternatives generated according to the problem specification of FIG. 4, according to various embodiments of the present invention.

Upon identifying one or more relevant solution approaches 220, approach identification module 206 provides the identified solution approaches to solution generation module 208. Solution generation module 208 then generates solutions 210-0, 210-1, and 210-2 based on solution approaches 220-0, 220-1, and 220-2, respectively. Each one of solutions 210 reflects a spectrum of different feasible designs, each generated using the same engineering procedure outlined in the corresponding solution approach 220. For example, suppose solution approach 220-0 specific a topology optimization algorithm. Solution generation module 208 could apply that optimization algorithm, with the particular design objectives, design constraints, and other relevant inputs derived from problem specification 204, to generate each one of solutions 210-0. In doing so, solution generation module 208 may vary certain input parameters in order to arrive at a spectrum of related solutions 210-0. FIG. 5, discussed below, illustrates exemplary spectra of solutions to an engineering problem.

Once solution generation module 208 generates a collection of different solutions 210, solution evaluation module 212 evaluates the different solutions to generate evaluation results 214. Evaluation module 212 may perform any technically feasible form of engineering analysis in order to evaluate solutions 210, including analyses of how closely each design solution fits problem specification 204, as well as analyses of the design tradeoffs associated with each design.

In one embodiment, solution generation module 208 and solution evaluation module 212 may interoperate in an iterative fashion to generate and evaluate solutions 210. In particular, solution evaluation module 212 may provide evaluation results 214 to solution generation module 208 along a feedback pathway (not shown). Based on those results, solution generation module 208 repeat the solution generation procedure, based on the identified solution approaches, with input parameters varied according to evaluation results 214. In this manner, solution generation module 208 and solution evaluation module 212 may perform any number of different iterations until converging upon a collection of solutions 210 that meet the criteria set forth in design specification 204, or meet that criteria to a threshold degree.

Once solutions 210 are finalized and solution evaluation module 212 generates evaluation results 214, solution evaluation module 212 then generates an interactive graphical user interface (GUI) that depicts the various analyses performed, and displays that GUI to the end-user. An exemplary GUI generated in this manner is described below in conjunction with FIG. 6

Figure 3:
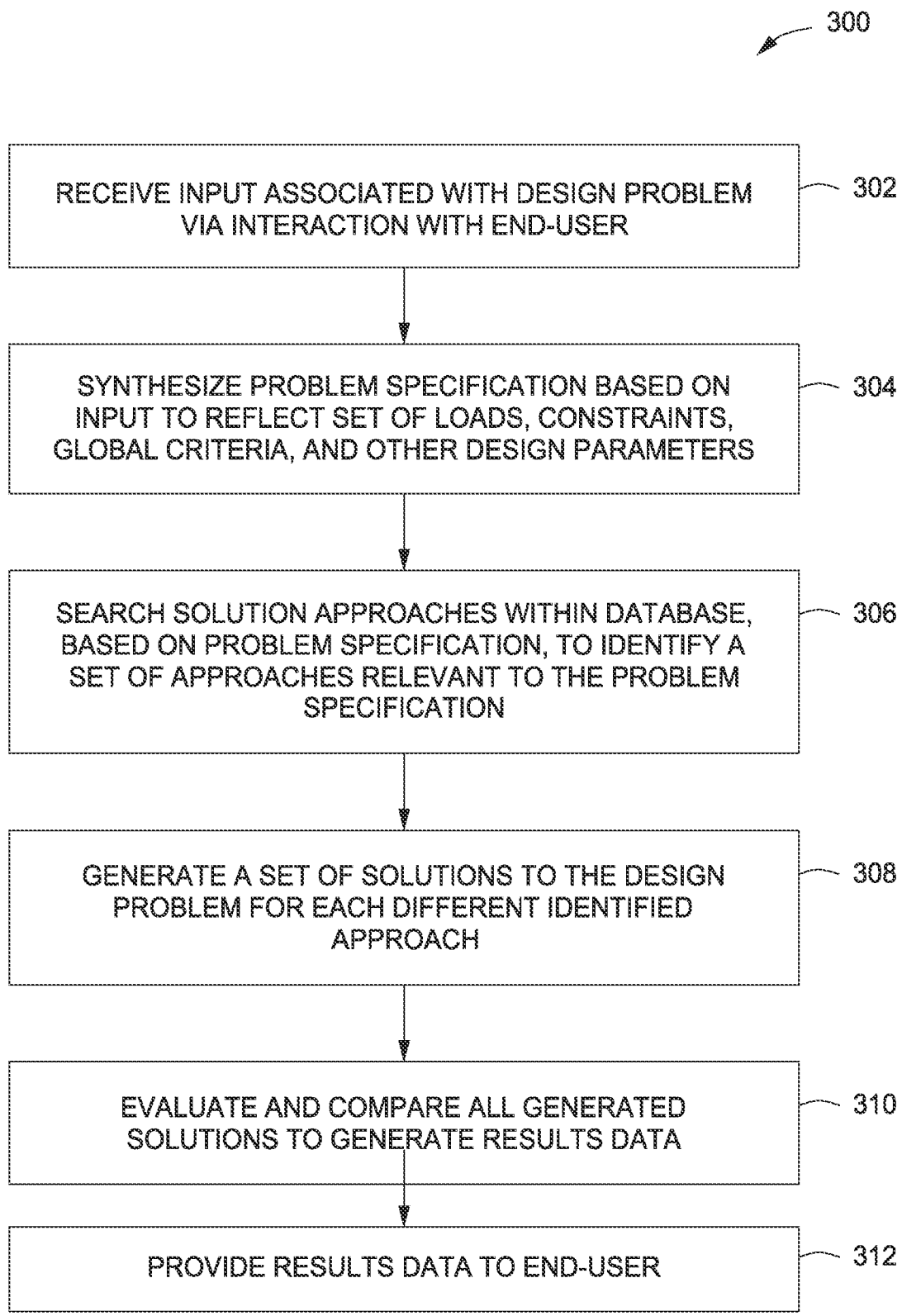
FIG. 3 is a flow diagram of method steps for generating a set of feasible design alternatives, according to various embodiments of the present invention.

FIG. 3 is a flow diagram of method steps for generating a set of feasible design alternatives, according to various embodiments of the present invention. Although the method steps are described in conjunction with the systems of FIGS. 1-2, persons skilled in the art will understand that any system configured to perform the method steps, in any order, is within the scope of the present invention.

As shown, a method 300 begins at step 302, where design application 120 receives user input 202 associated with a particular engineering design problem via interaction with the end-user. The received user input 202 generally reflects design objectives, design constraints, and other criteria associated with the design problem at hand.

At step 304, design application 120 synthesizes problem specification 204 based on user input 202 received at step 302. Problem specification 204 is a data structure that encapsulates all relevant information associated with the design problem in question, including design objectives, design constraints, and other engineering criteria. In one embodiment, design application 120 includes a synthesis module that generates problem specification 204 based on user input 202.

At step 306, approach identification module 206 searches solution approaches 220 within database 122 based on problems specification 204, to identify a set of solution approaches relevant to problem specification 204. In the context of this disclosure, a solution approach may be considered "relevant" to a given problem specification 204 if that solution approach is capable of generating a design that meets the criteria set forth in problem specification 204. Approach identification module 206 may determine relevance in a wide variety of different ways, although generally, approach identification module 206 determines a particular classification for problem specification 204 and then retrieves solution approaches 220 associated with that classification, as discussed in conjunction with FIG. 2.

At step 308, solution generation module 208 generates solutions 210, based on the various solution approaches 220 identified at step 306, that meet the criteria set forth in design specification 204. In doing so, solution generation module 208 may apply one or more procedures outlined in each such approach, with varying input parameters, to arrive at a spectrum of solutions. Upon performing this process for each different solution approach identified at step 306, Solution generation module 208 generates different sets of solutions 210, each of which derives from a different one of the identified solution approaches, as also discussed above in conjunction with FIG. 2.

At step 310, solution evaluation engine 212 evaluates and compares the generated solutions to generate results data 214. Results data 214 may reflect any form of data generated via any technically feasible form of engineering analysis, including tradeoff analysis and other analytical or comparative techniques, as described above in conjunction with FIG. 2.

At step 312, solution evaluation engine 212 provides evaluation results 214 to the end user. To that effect, solution engine 212 generates an interactive GUI that allows the end-user to compare and contrast the various solutions generated by solution generation module 208. In one embodiment, evaluation results 214 may reflect the manufacturability of each design solution, and the interactive GUI generated by solution engine 212 may compare the manufacturability of each design solution to illustrate relative manufacturability between designs.

Generally, the techniques described herein relate to mechanical engineering design problems, although persons skilled in the art will understand that the disclosed techniques may also be applied to other branches of engineering, including electrical engineering, materials engineering, civil engineering, and so forth. An exemplary application of the techniques disclosed above provided in the context of mechanical engineering appears below in FIGS. 4-6.

Figure 4:
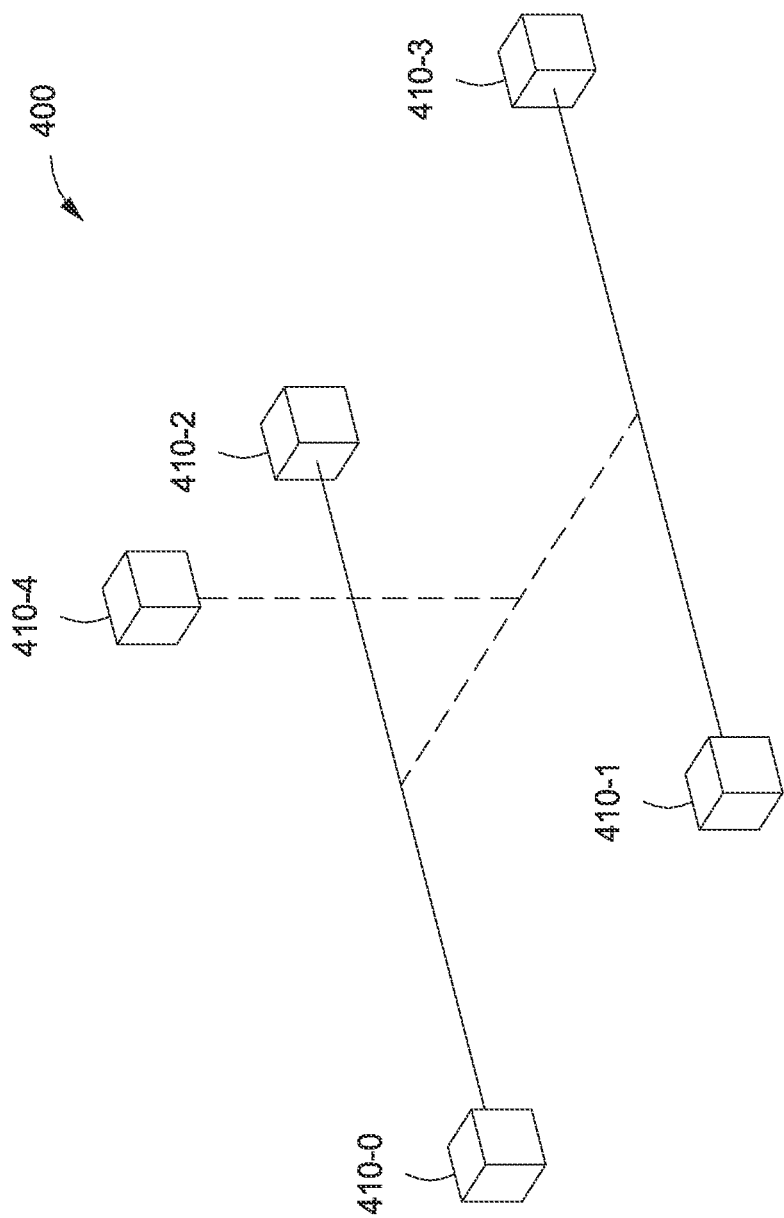
FIG. 4 is an exemplary depiction of a problem specification, according to various embodiments of the invention.

FIG. 4 is an exemplary depiction of a problem specification, according to various embodiments of the invention. As shown, problem specification 400 includes a collection of different ports 410 arranged according to a specific 3D geometry. Each port 410 represents a location where one or more forces are to be supported. Ports 410-0, 410-1, 410-2, and 410-3 all reside within the same horizontal plane, while port 410-4 is positioned above that plane.

Problem specification 400 sets forth specific design objectives. For example, problem specification 400 indicates that all forces associated with a given port 410 are balanced. Thus, a successful design that meets this design objective will describe a 3D structure that balances those forces. Problem specification 400 also sets forth specific design constraints. For example, problem specification 400 indicates that the successful design includes just five attachment points corresponding to ports 410-0 through 410-4, respectively. Thus, a successful design will have exactly five attachment points to a surrounding environment or structure.

Approach identification module 306 is configured to search solution approaches 220 within database 122, based on problem specification 400, to identify solution approaches that outline procedures capable of generating designs that meet the objectives and constraints associated with problems specification 400. Then, solution generation module 308 generates a spectrum of design solutions for each such solution approach, as described in exemplary fashion below in conjunction with FIG. 5.

FIG. 5 illustrates exemplary spectra of feasible design alternatives generated according to the problem specification of FIG. 4, according to various embodiments of the present invention. As shown spectrum 500 includes various solid designs 502-0 through 502-4. Solid designs 502 could be generated, for example, based on a solution approach that describes a topology optimization algorithm. With such an approach, solution generation module 308 could place material at particular locations within a 3D space to arrive at each solid design 502. By varying input parameters to that solution approach, solution generation module 308 would generate the different solid designs shown in spectrum 500.

As also shown, spectrum 510 includes various truss designs 512-0 through 512-4. Truss designs 512 could be generated, for example, based on a solution approach that describes a truss optimization procedure. With such an approach, solution generation module 308 could arrange and connect struts at specific locations within a 3D space to arrive at each truss design 512. By varying input parameters to that solution approach, solution generation module 308 would generate the different truss designs shown in spectrum 510. Based on the different designs generated in this manner, solution evaluation engine 312 generates an interactive GUI that presents various engineering analyses performed with the different designs, as described in greater detail below in conjunction with FIG. 6.

Figure 6:
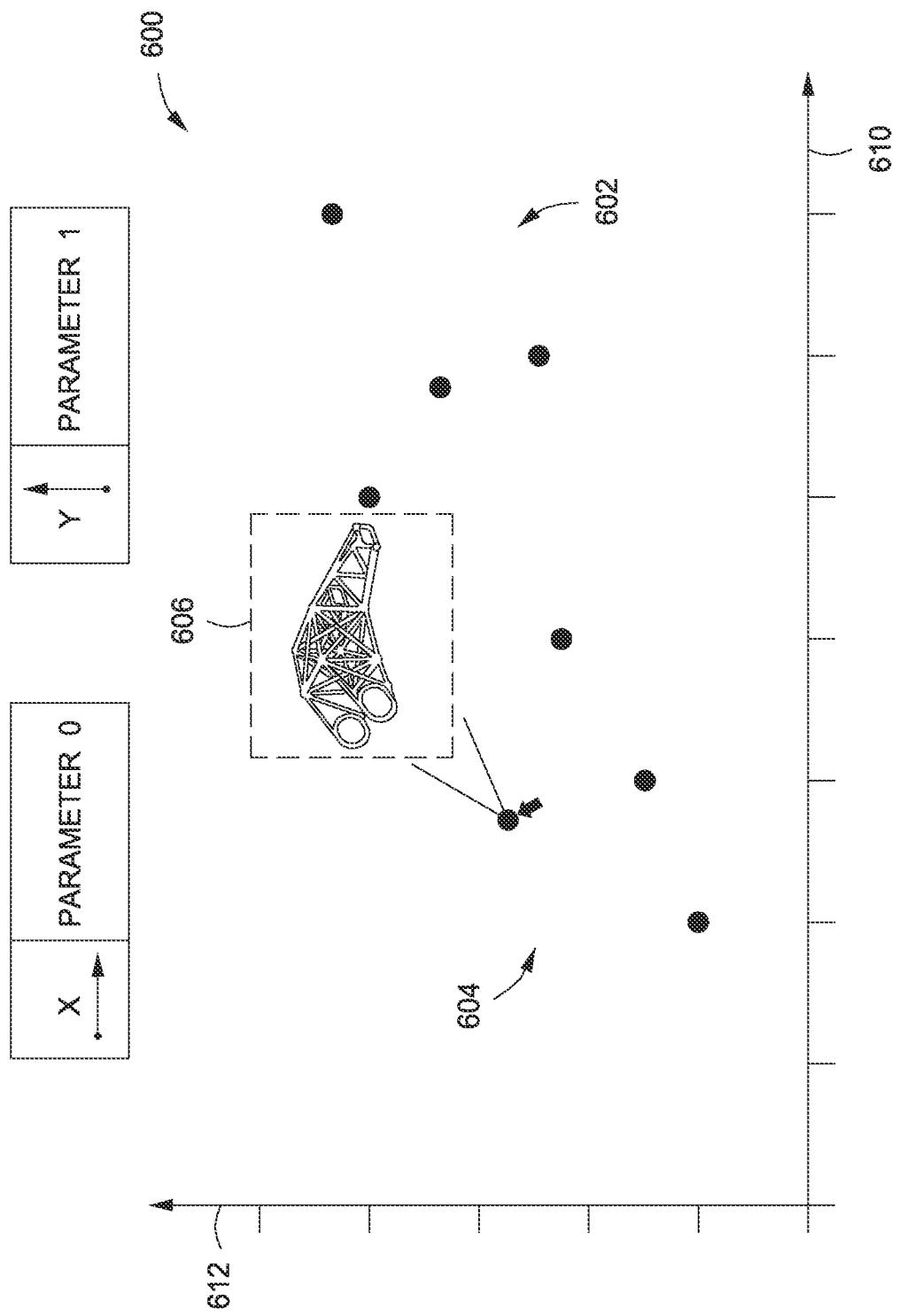
FIG. 6 illustrates a graphical user interface (GUI) for evaluating the spectra of feasible design alternatives of FIG. 5, according to various embodiments of the present invention.

FIG. 6 illustrates a graphical user interface (GUI) for evaluating the spectra of feasible design alternatives of FIG. 5, according to various embodiments of the present invention. As shown, a plot 600 includes an X-axis 610 and a Y-axis 612. Various groups 602 and 604 of design solutions reside on graph 600. Each design solution is positioned at a particular X-Y location based on the values of different parameters. X-axis 610 corresponds to parameter 0, and Y-axis 620 corresponds to parameter 1. Thus, each design solution may be positioned at an X-Y location on plot 600 based on the respective values of parameters 0 and 1.

In the example discussed herein, parameter 0 could represent weight, while parameter 1 could represent maximum load. Group 604 could represent spectrum 510 of design solutions, while group 602 could represent spectrum 500 of design solutions. Since the truss-type solutions associated with spectrum 510 are lighter and potentially less strong than the solid-type solutions associated with spectrum 500, group 604 resides closer to the origin of plot 600, indicating lower weight and lower maximum load. Conversely, since the solid-type solutions associated with spectrum 500 are heavier and potentially stronger than the truss-type solutions associate with spectrum 510, group 602 resides further from the origin of plot 600 in both the X and Y directions.

Persons skilled in the art will understand that FIGS. 4-6 are provided for exemplary purposes only and not meant to limit the scope of the claimed embodiments. As a general matter, design application 120 may be implemented to solve a wide range of engineering design problems and to arrive at a wealth of different feasible design solutions. Further, database 122 may include a potentially vast collection of solution approaches that represent widely ranging techniques to engineering design problems.

In sum, a design application generates feasible engineering designs that satisfy criteria associated with a particular engineering problem. The design application receives input that outlines a specific engineering problem to be solved, and then synthesizes a problem specification based on this input. The design application then searches a database to identify different approaches to solving the design problem set forth in the problem specification. The design application then selects one or more such approaches, and generates a spectrum of potential designs for each such approach. The generated designs may then be evaluated to determine the degree to which the problems specification has been met.

At least one advantage of the approach discussed herein is that the end-user need not attempt to consider all possible approaches to solving the design problem. Instead, the design application identifies potentially promising approaches, and then generates actual designs based on those approaches, thereby alleviating the burden of generating designs from the end-user.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. One or more non-transitory computer-readable media including instructions that, when executed by one or more processors, cause the one or more processors to generate a spectrum of design solutions, by performing the steps of:
   synthesizing a problem specification that indicates at least one design criterion;
   based on a classification of the problem specification, identifying within a database at least a first approach from a plurality of approaches for solving the problem specification, wherein each approach included in the plurality of approaches in the database comprises a different process for generating three-dimensional geometry for solving the problem specification;
   generating a spectrum of design solutions for the first approach, wherein the spectrum of design solutions comprises a plurality of design solutions, each design solution in the spectrum of design solutions representing a different instance of three-dimensional geometry that satisfies the at least one design criterion;
   evaluating manufacturability of a first design solution included in the spectrum of design solutions;
   evaluating manufacturability of a second design solution included in the spectrum of design solutions; and
   displaying, via a graphical user interface (GUI), the spectrum of design solutions for the first approach and a comparison of the manufacturability of the first design solution relative to the manufacturability of the second design solution.

2. The one or more non-transitory computer-readable media of claim 1,
   wherein identifying within the database at least the first approach comprises identifying different approaches for solving the problem specification that are included in the database and are associated with the classification of the problem specification.

3. The one or more non-transitory computer-readable media of claim 1, wherein generating the spectrum of design solutions for the first approach comprises:
   executing the first approach with a first set of input parameters to generate the first design solution to include in the spectrum of design solutions; and
   executing the first approach with a second set of input parameters to generate the second design solution to include in the spectrum of design solutions.

4. The one or more non-transitory computer-readable media of claim 1, further comprising:
   evaluating manufacturability of the first design solution included in the spectrum of design solutions to generate first evaluation results;
   evaluating manufacturability of the second design solution included in the spectrum of design solutions to generate second evaluation results; and
   generating the graphical user interface (GUI) that displays a comparison between the first evaluation results and the second evaluation results.

5. The one or more non-transitory computer-readable media of claim 1, wherein the first approach comprises a parametric modeling tool.

6. The one or more non-transitory computer-readable media of claim 1, wherein the first approach comprises procedural design synthesis methodology.

7. The one or more non-transitory computer-readable media of claim 1, wherein the first approach comprises a topology optimization algorithm.

8. The one or more non-transitory computer-readable media of claim 1, wherein the first approach comprises a truss optimization algorithm.

9. The one or more non-transitory computer-readable media of claim 1, wherein synthesizing the problem specification comprises synthesizing the problem specification based on input associated with a design problem.

10. The one or more non-transitory computer-readable media of claim 1, further comprising determining the classification of the problem specification by implementing at least one of an artificial neural network or a machine learning technique.

11. A computer-implemented method for generating a spectrum of design solutions, the method comprising:
   synthesizing a problem specification that indicates at least one design criterion;
   based on a classification of the problem specification, identifying within a database at least a first approach from a plurality of approaches for solving the problem specification, wherein each approach included in the plurality of approaches in the database comprises a different process for generating three-dimensional geometry for solving the problem specification;
   generating a spectrum of design solutions for the first approach, wherein the spectrum of design solutions comprises a plurality of design solutions, each design solution in the spectrum of design solutions representing a different instance of three-dimensional geometry that satisfies the at least one design criterion;
   evaluating manufacturability of a first design solution included in the spectrum of design solutions;
   evaluating manufacturability of a second design solution included in the spectrum of design solutions; and
   displaying, via a graphical user interface (GUI), the spectrum of design solutions for the first approach and a comparison of the manufacturability of the first design solution relative to the manufacturability of the second design solution.

12. The computer-implemented method of claim 11, wherein identifying within the database at least the first approach comprises identifying different approaches for solving the problem specification that are included in the database and are associated with the classification of the problem specification.

13. The computer-implemented method of claim 11, wherein generating the spectrum of design solutions for the first approach comprises:
   executing the first approach with a first set of input parameters to generate the first design solution to include in the spectrum of design solutions; and
   executing the first approach with a second set of input parameters to generate the second design solution to include in the spectrum of design solutions.

14. The computer-implemented method of claim 11, further comprising:
   evaluating manufacturability of the first design solution included in the spectrum of design solutions to generate first evaluation results;
   evaluating manufacturability of the second design solution included in the spectrum of design solutions to generate second evaluation results; and
   generating the graphical user interface (GUI) that displays a comparison between the first evaluation results and the second evaluation results.

15. The computer-implemented method of claim 11, wherein the first approach comprises a parametric modeling tool.

16. The computer-implemented method of claim 11, wherein the first approach comprises procedural design synthesis methodology.

17. The computer-implemented method of claim 11, wherein the first approach comprises a topology optimization algorithm.

18. The computer-implemented method of claim 11, wherein the first approach comprises a truss optimization algorithm.

19. A system for generating a spectrum of design solutions, comprising:
   a memory storing a design application; and
   a processor that, in conjunction with executing the design application:
      synthesizes a problem specification that indicates at least one design criterion;
      based on a classification of the problem specification, identifies within a database at least a first approach from a plurality of approaches for solving the problem specification, wherein each approach included in the plurality of approaches in the database comprises a different process for generating three-dimensional geometry for solving the problem specification;
      generates a spectrum of design solutions for the first approach, wherein the spectrum of design solutions comprises a plurality of design solutions, each design solution in the spectrum of design solutions representing a different instance of three-dimensional geometry that satisfies the at least one design criterion;
      evaluates manufacturability of a first design solution included in the spectrum of design solutions;
      evaluates manufacturability of a second design solution included in the spectrum of design solutions; and
      displays, via a graphical user interface (GUI), the spectrum of design solutions for the first approach and a comparison of the manufacturability of the first design solution relative to the manufacturability of the second design solution.

\* \* \* \* \*